United States Patent [19]

Miwada

[11] Patent Number: 5,287,393
[45] Date of Patent: Feb. 15, 1994

[54] CHARGE TRANSFER DEVICE EQUIPPED WITH CHARGE SIGNAL DETECTOR IMPROVED IN SENSITIVITY AS WELL AS IN VOLTAGE AMPLIFICATION

[75] Inventor: Kazuo Miwada, Tokyo, Japan

[73] Assignee: Nec Corporation, Tokyo, Japan

[21] Appl. No.: 822,751

[22] Filed: Jan. 21, 1992

[30] Foreign Application Priority Data

Jan. 18, 1991 [JP] Japan .................................. 3-4193

[51] Int. Cl.$^5$ ..................... H01L 219/76; G11C 19/28
[52] U.S. Cl. ........................................ 377/60; 377/58;
377/63; 257/239
[58] Field of Search ........................ 377/57, 58, 59, 60,
377/61, 62, 63; 257/239; 307/448, 468, 475,
571, 607; 358/213.26, 213.27, 213.29

[56] References Cited

U.S. PATENT DOCUMENTS

| | | | |
|---|---|---|---|
| 4,603,426 | 7/1986 | Sauer | 377/60 |
| 4,700,085 | 10/1987 | Miwada | 307/350 |
| 5,029,190 | 2/1991 | Narabu et al. | 377/60 |
| 5,033,068 | 7/1991 | Imai | 377/60 |

FOREIGN PATENT DOCUMENTS

| | | | |
|---|---|---|---|
| 55-067169 | 5/1980 | Japan | 257/239 |
| 59-229834 | 12/1984 | Japan | 257/239 |
| 60-220972 | 11/1985 | Japan | 257/239 |

*Primary Examiner*—William L. Sikes
*Assistant Examiner*—Tai V. Duong
*Attorney, Agent, or Firm*—Sughrue, Mion, Zinn, Macpeak & Seas

[57] ABSTRACT

A charge coupled device transfers a charge packet to a floating diffusion region for producing voltage variation therein, and the voltage variation is relayed to an output terminal by means of a driving unit implemented by a plurality of source follower circuits coupled in cascade, wherein each of the second to final source follower circuits is implemented by a series combination of an enhancement type driving transistor and an enhancement type load transistor, and the enhancement type load transistor changes the channel conductance thereof complementary to the enhancement type driving transistor under the control of a control unit so as to improve the dynamic range of the output signal thereof without sacrifice of the sensitivity of the floating diffusion region.

10 Claims, 6 Drawing Sheets

CHARGE TRANSFER DEVICE EQUIPPED WITH CHARGE SIGNAL DETECTOR IMPROVED IN SENSITIVITY AS WELL AS IN VOLTAGE AMPLIFICATION

FIELD OF THE INVENTION

This invention relates to an image sensor and, more particularly, to a charge signal detecting circuit incorporated in the image sensor.

DESCRIPTION OF THE RELATED ART

A typical example of the charge signal detecting circuit is disclosed by Eiji Oda et. al. in "A 1920 (H)×1035(V) Pixel High-Definition CCD Image Sensor", IEEE Journal of Solid State Circuits, vol. 24, No. 3, 1989, pages 711 to 717, and the prior art charge detecting circuit is shown in FIG. 1 of the drawings.

Referring to FIG. 1, a charge transfer device is fabricated on a single semiconductor chip 1, and the charge transfer device comprises a charge transfer region 2a defined in the semiconductor substrate 1. The charge transfer region 2a forms a shift register 2 together with a plurality of transfer electrodes 2b sequentially applied with a transfer clock signal CLt, and an output electrode 2c is provided between the final stage of the shift register 2 and a floating gate region 3. The shift register 2 is contiguous to the floating diffusion region 3 in the presence of the output signal CLout, and the floating diffusion region 3 is electrically isolated from the semiconductor substrate 1 by means of a p-n junction 4 reversely biased. The floating diffusion region 3 is further coupled with a depletion type field effect transistor 5, and the depletion type field effect transistor 5 is responsive to a reset signal CLr for equalizing the floating diffusion region 3 with a reset voltage level Vrd.

The floating diffusion region 3 is further coupled with a driver circuit 6, and the driver circuit 6 comprises three stages of source follower circuits 6a, 6b and 6c coupled in cascade. Each of the source follower circuits 6a to 6c is implemented by a series combination of a driving transistor 6aa and a load transistor 6ab, and the source follower circuits 6a to 6c decrease the output impedance for high speed operation. The driving transistor 6aa of the source follower circuit 6a is gated by the floating diffusion region 3, and the driving transistors 6aa of the source follower circuits 6b and 6c are coupled with the common drain nodes of the previous stages. The common drain node of the source follower circuit 6c is coupled with an output node OUT, and voltage variation due to a charge signal transferred to the floating diffusion region 3 is increased at the output node OUT.

The prior art charge transfer device thus arranged behaves as follows. FIG. 2 shows the waveforms of the transfer clock signal CLt, the waveform of the reset signal CLr and the voltage variation in the floating diffusion region 3. Assuming now that the shift register 2 conveys a charge signal or a charge packet, the reset signal CLr is lifted to a high voltage level at time t1, and the depletion type field effect transistor 5 conducts the source of the reset voltage level Vrd to the floating diffusion region 3. For this reason, the floating diffusion region 3 reaches the reset voltage level Vrd by time t2. However, the reset signal CLr is recovered to a low voltage level at time t3, and the floating diffusion region 3 enters a floating state by time t4. Since the output signal CLout has already allowed the output electrode 2c to form a conductive channel to the floating diffusion region 3, the transfer clock signal CLt decayed to the low voltage level allows the shift register 2 to sweep the charge signal into the floating diffusion region 3, and the charge signal thus swept into the floating diffusion region 3 is causes voltage variation indicated by dVp. The voltage variation at the floating diffusion region 3 is relayed through the source follower circuits 6a to 6c, and an output signal is produced at the output node OUT.

The voltage variation dVp is given as follows.

$$dVp = dQ/Ct \qquad \text{Equation 1}$$

where dQ is the electric charge of the charge signal, and Ct is the total capacitance coupled with the floating diffusion region 3. The capacitance at the p-n junction 4, the parasitic capacitance at the gate electrode of the driving transistor 6aa of the first emitter follower circuit 6a and the parasitic capacitance of wiring between the floating diffusion region 3 and the driving transistor 6aa form the total capacitance Ct. As will be understood from Equation 1, the smaller the total capacitance Ct is, the larger the voltage variation dVp is. In other words, if the total capacitance Ct is decreased, the floating diffusion region 3 is improved in sensitivity. In general, the parasitic capacitance of the driving transistor 6aa is proportional to the dimensions of the gate electrode or the transistor size, and, for this reason, the driving transistor 6aa of the source follower circuit 6a is implemented by a field effect transistor as small as possible. However, a small sized field effect transistor is also small in current driving capability. In fact, the driving transistor 6aa of the source follower circuit 6a has the ratio of the channel width to the channel length W/L of about 5 micron/4 micron, and, for this reason, the prior art driving circuit 6 is implemented by a multi-stage source follower configuration.

However, a problem is encountered in the prior art charge transfer device in voltage amplification. In detail, the source follower circuits 6a to 6c are as small in voltage amplification as 0.85 to 0.90, and only 70 per cent of the voltage variation dVp is transferred to the output node OUT. Of course, if the driving circuit 6 is implemented by only a single stage of source follower circuit, most of the voltage variation is transferred to the output node OUT, and the dynamic range of the output signal is improved. However, this approach encounters another problem in sensitivity of the floating diffusion region 3, because the driving transistor large enough to drive the load at high-speed deteriorates the sensitivity due to large parasitic capacitance coupled to the gate electrode thereof. Thus, there is a trade-off between the sensitivity of the floating diffusion region 3 and the dynamic range of the output signal.

SUMMARY OF THE INVENTION

It is therefore an important object of the present invention to provide a charge transfer device which is large in sensitivity without sacrificing the dynamic range of an output signal.

To accomplish the object, the present invention proposes to gate a load transistor complementary to an associated driving transistor.

In accordance with the present invention, there is provided a charge transfer device comprising a) a charge transfer line for transferring a charge packet to a final stage thereof, b) a floating diffusion region electrically connectable with the final stage, and allowing a voltage level thereat to vary with the charge packet, c) a driving unit coupled between the floating diffusion region and an output terminal, and implemented by a plurality of source follower circuits coupled in cascade, a source follower circuit with an output node serving as an initial stage of the driving unit being gated by the floating diffusion region, the others of the plurality of source follower circuits being respectively implemented by series combinations of driving transistors, output nodes and load transistors coupled between a first source of power voltage level and a second source of power voltage level, each of the output nodes of the plurality of source follower circuits being coupled with a gate electrode of the driving transistor of the next stage or the output terminal, and d) a control signal producing means operative to produce a control signal, and supplying the control signal to gate electrodes of the load transistors of the others of the plurality of source follower circuits, the control signal allowing the load transistors to change channel conductances thereof in complementary manner with respect to those of the associated driving transistors.

BRIEF DESCRIPTION OF THE DRAWINGS

The feature and advantages of the charge transfer device according to the present invention will be more clearly understood from the following description taken in conjunction with the accompanying drawings in which.

DESCRIPTION OF THE PREFERRED EMBODIMENTS

First Embodiment

Figure 1:
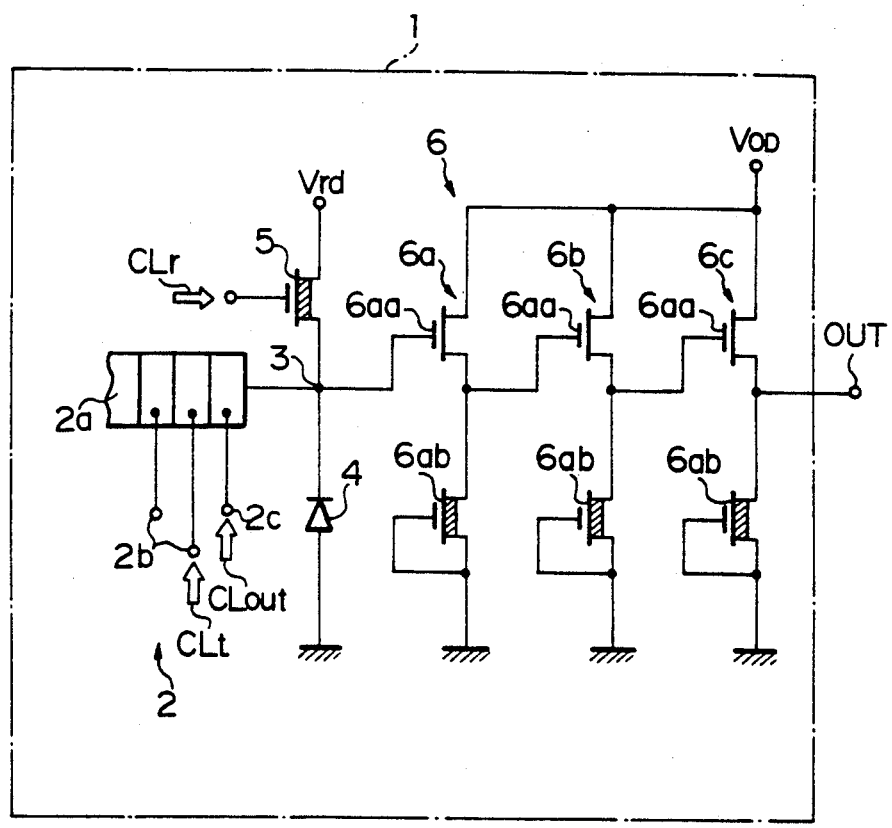
FIG. 1 is a circuit diagram showing the arrangement of the prior art charge transfer device.
Figure 2:
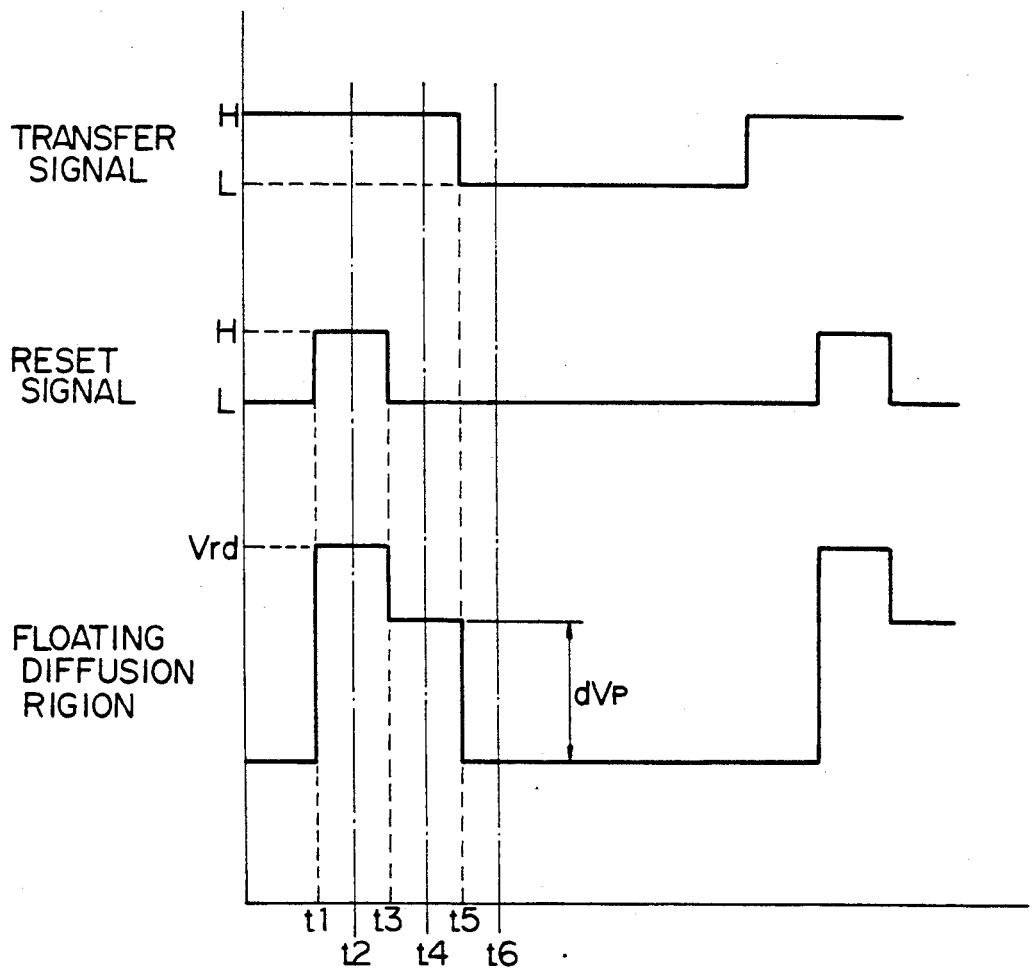
FIG. 2 is a graph showing the waveforms of essential signals produced in the prior art charge transfer device.
Figure 3:
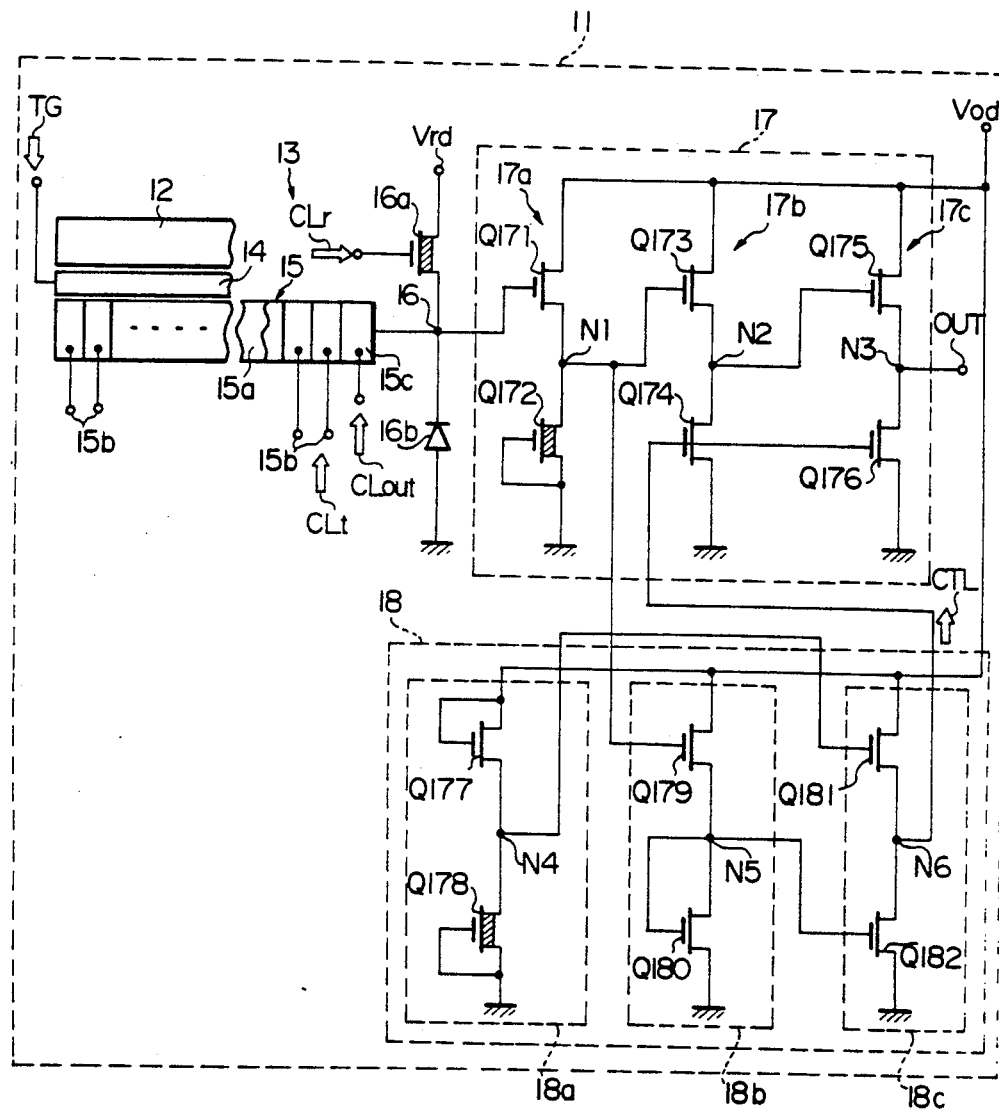
FIG. 3 is a circuit diagram showing the circuit arrangement of a charge transfer device according to the present invention.

Referring to FIG. 3 of the drawings, an image sensor is fabricated on a single semiconductor chip 11, and largely comprises a photo-electric converting region 12, a charge transfer unit 13, and a transfer gate 14 periodically interconnecting the photo-electric converting region 12 and the charge transfer unit 13. The transfer electrode is responsive to a transfer signal TG, and charge packets are periodically read out from the photo-electric converting region 12 to the shift register 15.

The charge transfer device comprises a shift register 15, a floating diffusion region 16 associated with a reset transistor 16a, a driving unit 17 coupled between the floating diffusion region 16 and an output terminal OUT, and a control unit 18 provided in association with the driving unit 17.

The shift register 15 comprises a charge transfer region 15a formed in the semiconductor substrate 11, and a plurality of transfer gate electrodes 15b opposite to the charge transfer region 15a through a thin gate oxide film (not shown), and a multi-phase transferring clock signal CLt is sequentially supplied to the transfer gate electrodes 15b for conveying the charge packets towards the final stage thereof. An output electrode 15c is further provided over that area between the final stage and the floating diffusion region 16, and is responsive to an output signal CLout for providing a conductive channel therebetween.

The floating diffusion region 16 is formed in the semiconductor substrate 11, and is defined by a p-n junction 16b reversely biased. The reset transistor 16a is implemented by a depletion type field effect transistor coupled between a source of resetting voltage level Vrd and the floating diffusion region 16.

The driving unit 17 is implemented by a plurality of source follower circuits 17a, 17b and 17c coupled in cascade. The source follower circuit 17a serves as a first stage of the driving unit 17, and is implemented by a series combination of an enhancement type driving transistor Q171, an output node N1 and a depletion type load transistor Q172 coupled between a source of power voltage level Vod and a ground voltage line. The enhancement type driving transistor Q171 is gated by the floating diffusion region 16, and voltage variation in the floating diffusion region 16 is relayed to the output node N1 thereof.

The second source follower circuit 17b is implemented by a series combination of an enhancement type driving transistor Q173, an output node N2 and an enhancement type load transistor Q174 coupled between the source of power voltage level Vod and the ground voltage line, and the enhancement type driving transistor Q173 is gated by the output node N1. Similarly, the final source follower circuit 17c is implemented by a series combination of an enhancement type driving transistor Q175, an output node N3 and an enhancement type load transistor Q176 coupled between the source of power voltage level Vod and the ground voltage line, and the enhancement type driving transistor Q175 is gated by the output node N2. The output node N3 is coupled with the output terminal OUT. Thus, the source follower circuits 17a to 17c are coupled in cascade, and the voltage variation in the floating diffusion region 16 is sequentially relayed to the output terminal OUT.

The driving transistor Q171 of the first source follower circuit 17a is small enough to maintain the sensitivity of the floating diffusion region 16, and, accordingly, the voltage variation in the floating diffusion region 16 is not less than that of the prior art charge transfer device.

The control unit 18 largely comprises a constant voltage source 18a, a level shift circuit 18b and an inverting circuit 18c, and the inverting circuit 18c controls the channel conductances of the enhancement type load transistors Q174 and Q176 by the aid of the constant voltage source 18a and the level shift circuit 18b. In detail, the constant voltage source 18a is implemented by a series combination of an enhancement type load transistor Q177, an output node N4 and a depletion type load transistor Q178 coupled between the source of power voltage level Vod and the ground voltage line, and the gate electrodes of the two load transistors Q177 and Q178 are respectively coupled with the source nodes thereof. Then, a first predetermined constant voltage level lower than the power voltage level Vod is produced at the output node N4. The level shift circuit 18b is implemented by a series combination of an enhancement type first shifting transistor Q179, an output node N5 and an enhancement type second shifting transistor Q180 coupled between the source of power voltage level Vod and the ground voltage line. The enhancement type first shifting transistor Q179 is gated by the output node N1 of the source follower circuit 17a, and the enhancement type second shifting transistor Q180 is gated by the output node N5. The channel conductances of the enhancement type first and second shifting transistors Q179 and Q180 thus arranged are complimentarily varied, and the voltage level at the output node N1 is level-shifted to the output node N5. The inverting circuit 18c is implemented by a series combination of an enhancement type load transistor Q181, an output node N6 and an enhancement type third shifting transistor Q182 coupled between the source of power voltage level Vod and the ground voltage line, and the first predetermined constant voltage level at the output node N4 is supplied to the gate electrode of the enhancement type load transistor Q181. Since the enhancement type third shifting transistor Q182 is gated by the output node N5 of the level shift circuit 18b, the inverting circuit 18c produces an control signal CTL with voltage level complimentarily varied with respect to the voltage level at the output node N5. The control signal CTL is supplied to the gate electrodes of the enhancement type load transistors Q174 nd Q176. Since the voltage level of the control signal CTL is complimentarily varied with respect to the voltage level at the node N5, the control signal CTL is of a complementary signal of the output signal of the source follower circuit 17a, and the enhancement type load transistors Q174 and Q176 change the channel conductances thereof in a complementary manner to those of the enhancement type driving transistors Q173 and Q175, respectively. This results in improvement of the dynamic range of the output signal at the output terminal OUT.

Figure 4:
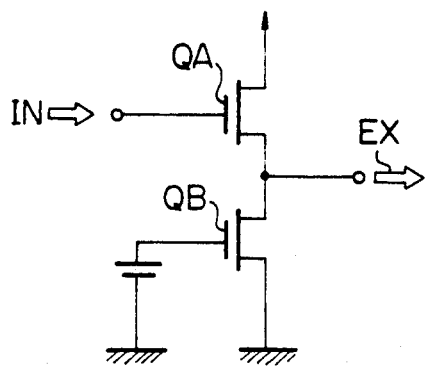
FIG. 4 is a circuit diagram showing a source follower circuit used for evaluation of characteristics.
Figure 5:
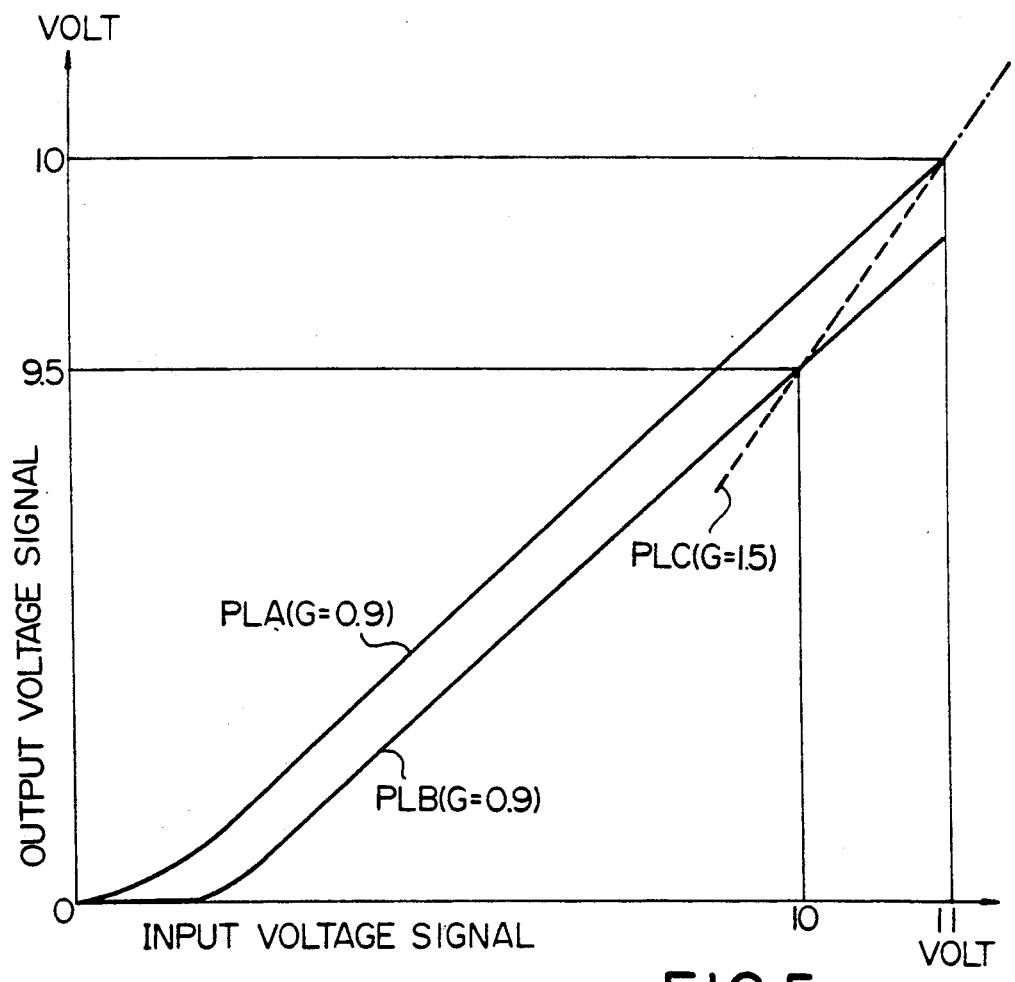
FIG. 5 is a graph showing characteristics of a source follower circuit shown in FIG. 4

FIG. 4 shows a source follower circuit implemented by two n-channel enhancement type field effect transistors QA and QB coupled in series, and an input voltage signal IN is supplied to the gate electrode of the enhancement type field effect transistor QA. The gate electrode of the enhancement type field effect transistor QB is supplied with a bias voltage level Vb, and an output voltage signal EX is produced at the common drain node of the two enhancement type field effect transistors QA and QB. Using the source follower circuit shown in FIG. 4, the input voltage-to-output voltage characteristics of the source follower circuit are plotted in FIG. 5. Plots PLS are indicative of the input voltage-to-output voltage characteristics of the source follower circuit in case where the bias voltage Vb is about 2 volts. If the bias voltage Vb is increased to about 3 volts, the input voltage-to-output voltage characteristics trace plots PLB. When the input voltage-to-output voltage characteristics trace plots PLA, the source follower circuit has a gain G of about 0.9. If the bias voltage is increased to about 3.0 volts, the offset voltage is lowered, because much current passes through the enhancement type field effect transistor QB. However, the gain G still remains at 0.9.

The present inventor noticed the gain G increasing along dash lines PLC when the bias voltage Bv was decreased from 3 volts to 2 volts. If the bias voltage Vb is decreased between the input voltage signal IN at 10 volts and the input voltage signal IN at 11 volts, the source follower circuit achieves the gain of about 1.5. The present inventor applied the principle described in conjunction with FIGS. 4 and 5 to the driving unit 17, and the bias voltage of the load transistors Q174 and Q176 is varied by means of the control unit 18 in complementary manner with respect to the voltage levels applied to the gate electrodes of the driving transistors Q173 and Q175.

Figure 6:
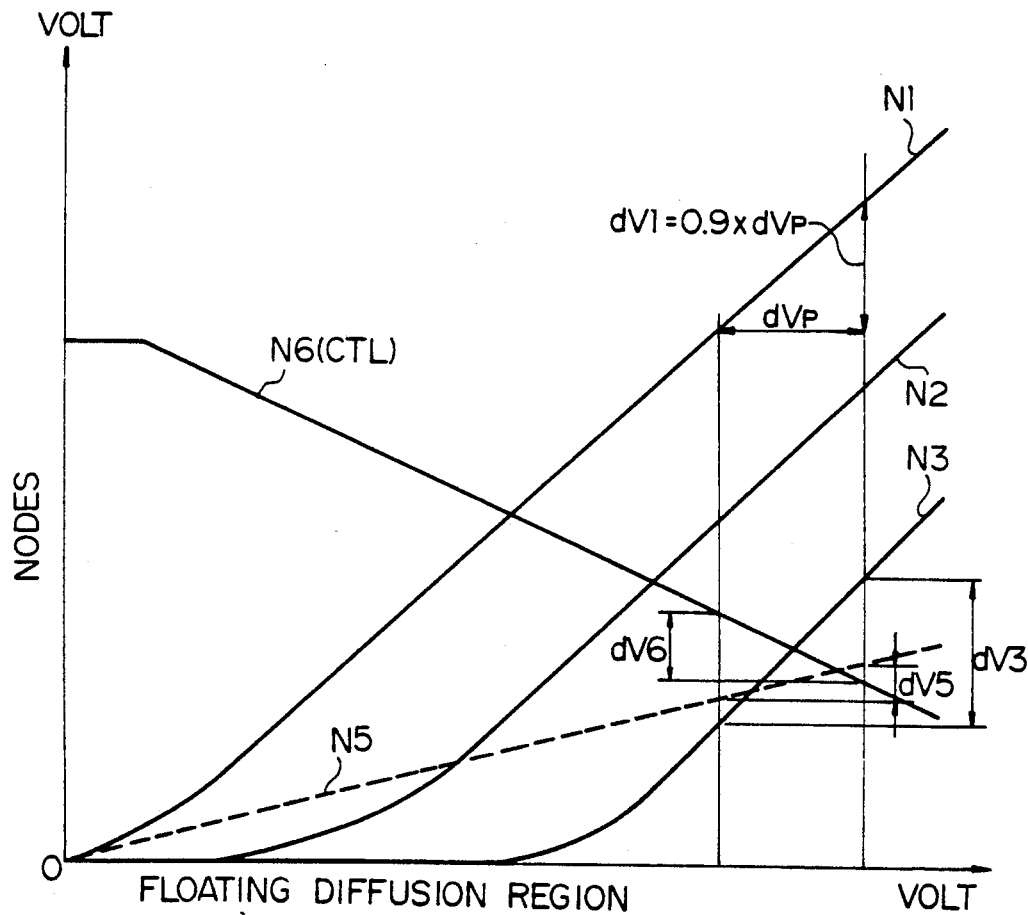
FIG. 6 is a graph showing the waveforms at essential nodes in the charge transfer device shown in FIG. 3.

The circuit behavior of the charge transfer device implementing the first embodiment is hereinbelow described with reference to FIG. 6 of the drawings. In FIG. 6, Plots N1, N2, N3, N5 and N6 are respectively indicative of voltage variations at the output nodes N1, N2, N3, N5 and N6. Assuming now that the voltage level Vp in the floating diffusion region 16 is increased by dVp, the source follower circuit 17a increases the voltage level at the output node N1 by dV1 which is about 90 percent of the voltage variation dVP at the floating diffusion region 16. Since the voltage variation dV1 is relayed to the level shift circuit 18b, the level shift signal at the output node N5 is increased by dV5, and the inverting circuit 18c decreases the control signal CTL by dV6. The enhancement type driving transistor Q173 increases the channel conductance thereof together with the voltage level at the output node N1, and the enhancement type load transistor Q174 decreases the channel conductance with the control signal CTL decreased by the inverting circuit 18c. Therefore, the source follower circuit 17b increases the gain more than unit as described hereinbefore. In a similar manner, the enhancement type driving transistor Q175 increases the channel conductance thereof together with the output node N2, and the control signal CTL causes the enhancement type load transistor to decrease the channel conductance thereof. Therefore, the source follower circuit 17c also increases the gain greater than 1. Thus, the source follower circuits 17b and 17c increase the respective gains, and the driving unit 17 improves the dynamic range of the output signal at the output terminal OUT.

As will be understood from the foregoing description, the source follower circuits 17b and 17c increase the respective gains by virtue of the control signal CTL produced by the control unit 18, and the dynamic range of the output signal is surely improved without sacrifice of the sensitivity of the floating diffusion region 16.

Second Embodiment

Figure 7:
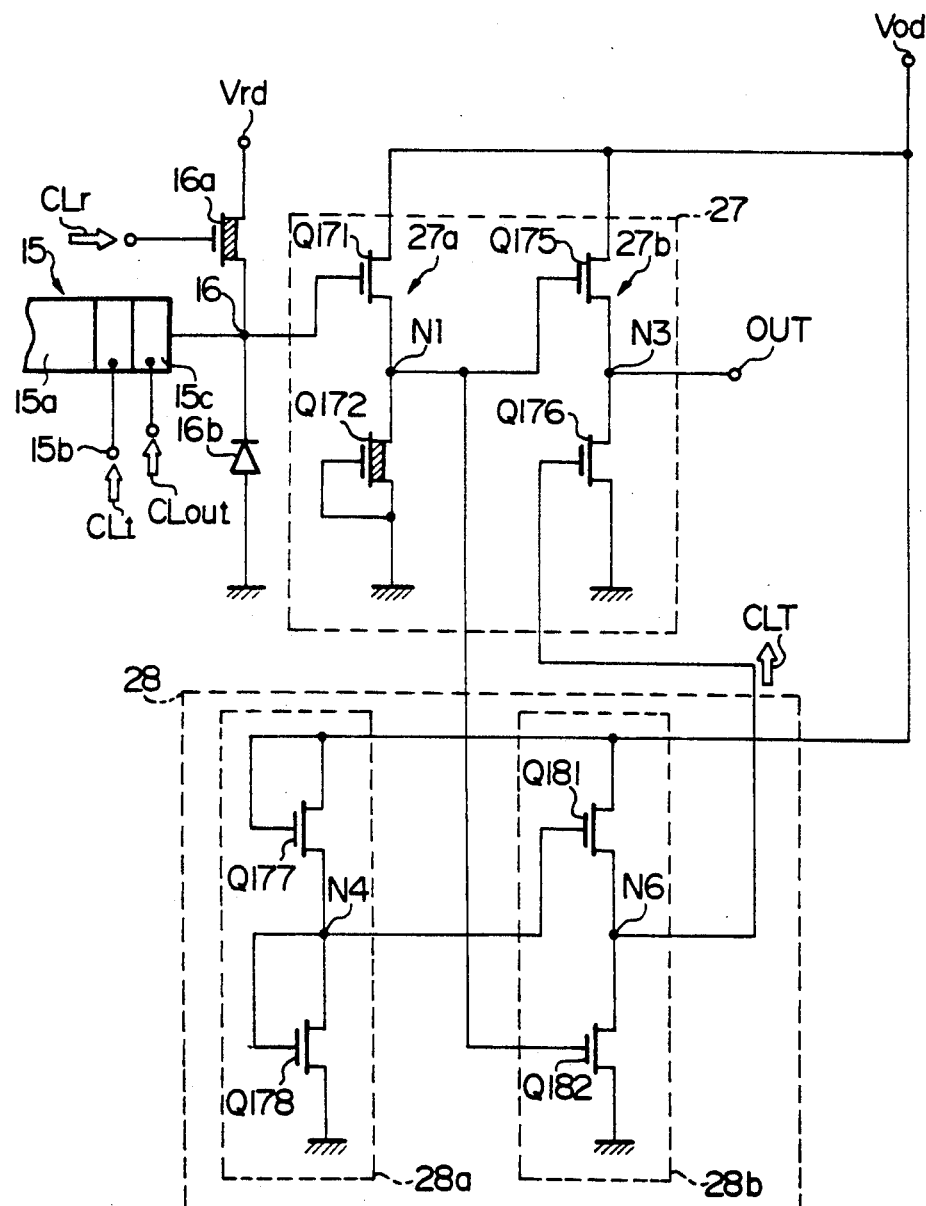
FIG. 7 is a circuit diagram showing the arrangement of another charge transfer device according to the present invention.

Turning to FIG. 7 of the drawings, another charge transfer device embodying the present invention is illustrated. The charge transfer device implementing the second embodiment is similar to the first embodiment except for a driving unit 27 and a control unit 28, and the other components are labeled with the same reference used for the first embodiment.

The driving unit 27 is implemented by two source follower circuits 27a and 27b coupled in cascade, and the source follower circuits 27a and 27b are respectively similar in arrangement to the source follower circuits 17a and 17c. The control unit 28 comprises a constant voltage source 28a and an inverting circuit 28b which are similar in circuit arrangement to the constant voltage source 18a and the inverting circuit 18c, respectively. For this reason, component transistors and nodes of those circuits 27a, 27b, 28a and 28c are designated by the same references denoting the corresponding transistors and nodes of the first embodiment without any detailed description. In the second embodiment, a level-shift circuit is deleted from the control unit 28, and the enhancement type shifting transistor Q182 is directly gated by the output node N1 of the source follower circuit 27a.

The charge transfer device implementing the second embodiment behaves similar to the first embodiment, and no further description is hereinbelow incorporated for the sake of simplicity.

Although particular embodiments of the present invention have been shown and described, it will be obvious to those skilled in the art that various changes and modifications may be made without departing from the spirit and scope of the present invention.

What is claimed is:

1. A charge transfer device comprising:
   a) a charge transfer line for transferring a charge packet to a final stage thereof,
   b) a floating diffusion region electrically connectable with said final stage, and allowing a voltage level thereat to vary with said charge packet,
   c) a driving unit coupled between said floating diffusion region and an output terminal, and implemented by a plurality of source follower circuits coupled in cascade, a source follower circuit with an output node serving as an initial stage of said driving unit being gated by said floating diffusion region for producing an output signal from said voltage level of said floating diffusion region at the output node thereof, the others of said plurality of source follower circuits being respectively implemented by series combinations of driving transistors, output nodes and load transistors coupled between a first source of power voltage level and a second source of power voltage level, each of said output nodes of said plurality of source follower circuits being coupled with a gate electrode of said driving transistor of the next stage, an output node of a source follower circuit serving as a final stage being coupled to said output terminal, so as to produce one of a secondary output signal for controlling said driving transistor of the next stage, similar to said output signal, and a final output signal at said output terminal, and
   d) means coupled with gate electrodes of said load transistors and said output node of said source follower circuit serving as said initial stage for varying channel conductances of said load transistors complimentarily with respect to those of said driving transistors on the basis of said output signal.

2. A charge transfer device comprising:
   a) a charge transfer line for transferring a charge packet to a final stage thereof,
   b) a floating diffusion region electrically connectable with said final stage, and allowing a voltage level thereat to vary with said charge packet,
   c) a driving unit coupled between said floating diffusion region and an output terminal, and implemented by a plurality of source follower circuits coupled in cascade, a source follower circuit with an output node serving as an initial stage of said driving unit being gated by said floating diffusion region for producing an output signal from said voltage level of said floating diffusion region at the output node thereof, the others of said plurality of source follower circuits being respectively implemented by series combinations of driving transistors, output nodes and load transistors coupled between a first source of power voltage level and a second source of power voltage level, each of said output nodes of said plurality of source follower circuits being coupled with a gate electrode of said driving transistor of the next stage, an output node of a source follower circuit serving as a final stage being coupled to said output terminal, so as to sequentially produce one of a secondary output signal for controlling said driving transistor of the next stage, similar to said output signal of said initial stage, and a final output signal at said output terminal, and
   d) a control signal producing means, coupled with said output node of said source follower circuit serving as said initial stage, for producing a control signal complementary to said output signal, and for supplying said control signal to gate electrodes of said load transistors of the others of said plurality of source follower circuits, said control signal allowing said load transistors to change channel conductances thereof in complementary manner with respect to those of said associated driving transistors.

3. A charge transfer device as set forth in claim 2, in which said driving transistors and said load transistors of the others of said plurality of source follower circuits are of an enhancement type.

4. A charge transfer device as set forth in claim 3, in which said control signal producing means comprises: d-1) a constant voltage source coupled between said first source of power voltage level and said second source of power voltage level for producing a predetermined constant voltage level, d-2) a level shift circuit coupled between said first source of power voltage level and said second source of power voltage level, and operative to produce a level-shift signal on the basis of said output signal of said initial stage of said driving unit, and d-3) an inverting circuit implemented by a series combination of a load transistor, an output node and a shifting transistor coupled between said first source of power voltage level and said second source of power voltage level, said load transistor of said inverting circuit being supplied with said predetermined constant voltage level, said shifting transistor being gated by said level-shift signal.

5. A charge transfer device as set forth in claim 4, in which said constant voltage source is implemented by a series combination of two load transistors coupled between said first source of power voltage level and said second source of power voltage level, said two load transistors having respective gate electrodes coupled with said first source of power voltage level and said second source of power voltage level, respectively.

6. A charge transfer device as set forth in claim 4, in which said level shift circuit is implemented by a series combination of two shifting transistors coupled between said first source of power voltage level and said second source of power voltage level, one of said two shifting transistors having a gate electrode supplied with said output signal of said initial stage, the other of said two shifting transistors having a gate electrode supplied with said level-shift signal.

7. A charge transfer device as set forth in claim 3, in which said charge transfer device is incorporated in an image sensor.

8. A charge transfer device as set forth in claim 3, in which said control signal producing means comprises: d-1) a constant voltage source coupled between said first source of power voltage level and said second source of power voltage level for producing a predetermined constant voltage level, and d-2) an inverting circuit implemented by a series combination of a load transistor, an output node and a shifting transistor coupled between said first source of power voltage level and said second source of power voltage level, said load transistor of said inverting circuit being supplied with said predetermined constant voltage level, a gate electrode of said shifting transistor being supplied with said output signal of said initial stage of said driving unit.

9. A charge transfer device as set forth in claim 8, in which said constant voltage source is implemented by a series combination of two load transistors coupled between said first source of power voltage level and said second source of power voltage level, said two load transistors having respective gate electrodes coupled with said first source of power voltage level and said second source of power voltage level, respectively.

10. A charge transfer device comprising:
a) a charge transfer line for transferring a charge packet to a final stage of said charge line transfer,
b) a floating diffusion region electrically connectable with said final stage, and allowing a voltage level thereat to vary with said charge packet,
c) a driving unit coupled between said floating diffusion region and an output terminal, and implemented by a plurality of source follower circuits coupled in cascade, a first source follower circuit serving as an initial stage of said driving circuit gated by said floating diffusion region for producing an output signal from said voltage level of said floating diffusion region at the output node thereof, each of said plurality of source follower circuits having a driving transistor and an output node coupled with a gate electrode of said driving transistor of the next stage or with said output terminal, at least one of said plurality of source follower circuits except for said first source follower circuit being implemented by a series combination of said driving transistor, said output node and a load transistor so as to produce one of a secondary output signal for controlling said driving transistor of the next stage, similar to said output signal, and a final output signal at said output terminal, and
d) a control signal producing means, coupled with said output node of said source follower circuit serving as said initial stage, for producing a control signal complementary to said output signal, and for supplying said control signal to a gate electrode of said load transistor, said control signal allowing said load transistor to change channel conductance thereof in complementary manner with respect to that of a corresponding driving transistor.

* * * * *

UNITED STATES PATENT AND TRADEMARK OFFICE
CERTIFICATE OF CORRECTION

PATENT NO. : 5,287,393
DATED : February 15, 1994
INVENTOR(S) : Kazuo MIWADA

It is certified that error appears in the above-identified patent and that said Letters Patent is hereby corrected as shown below:

On title page, item [73] delete
"Nec" and insert --NEC--.

Col. 5, line 57, delete "PLS" and insert --PLA--.

Col. 6, line 2, delete "Bv" and insert --Vb--.

Signed and Sealed this

Tenth Day of January, 1995

Attest:

BRUCE LEHMAN

Attesting Officer

Commissioner of Patents and Trademarks